United States Patent [19]

Lu

[11] 4,053,316
[45] Oct. 11, 1977

[54] PHOTOPOLYMERIZATION OF ETHYLENICALLY-UNSATURATED ORGANIC COMPOUNDS

[75] Inventor: Robert T. Lu, Wilmington, Del.

[73] Assignee: ICI United States Inc., Wilmington, Del.

[21] Appl. No.: 670,027

[22] Filed: Mar. 24, 1976

Related U.S. Application Data

[62] Division of Ser. No. 341,992, March 16, 1973, Pat. No. 3,982,942.

[51] Int. Cl.² .................. G03C 1/68; C08F 2/46; C08F 4/00
[52] U.S. Cl. .................. 96/115 P; 96/115 R; 204/159.18; 204/159.19; 204/159.23; 204/159.24
[58] Field of Search ............ 96/115 R, 115 F; 204/159.18, 159.23, 159.24, 159.19

[56] References Cited

U.S. PATENT DOCUMENTS

| 2,350,445 | 9/1958 | Oster | 204/159.23 |
| 2,875,047 | 2/1959 | Oster | 96/35 |
| 3,090,664 | 5/1963 | Cline et al. | 204/159.15 |

FOREIGN PATENT DOCUMENTS

| 1,027,148 | 3/1966 | United Kingdom |

OTHER PUBLICATIONS

Strohmeier et al., Chem. Abstracts vol. 62, 13241e (1965).

*Primary Examiner*—Jack P. Brammer

[57] ABSTRACT

This invention relates to photopolymerizable compositions comprising an ethylenically unsaturated organic compound and a visible light photosensitizing composition comprising a combination of $Mn_2(CO)_{10}$ and a co-catalyst selected from the group consisting of a compound characterized by the formula

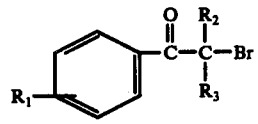

wherein $R_1$ is —H, —Br, or —$CH_3$, $R_2$ is —H or —$CH_3$, and $R_3$ is —H or —$CH_3$; cumene; diisopropyl benzene; alkyl mercaptans containing from 10 to 16 carbon atoms; thiourea; and mixtures thereof and to polymerized products thereof. The invention also provides a process for photopolymerizing ethylenically unsaturated organic compounds with visible light in the range of 4,000 to 7,000 angstroms.

7 Claims, No Drawings

PHOTOPOLYMERIZATION OF ETHYLENICALLY-UNSATURATED ORGANIC COMPOUNDS

This is a division, of application Ser. No. 341,992, filed Mar. 16, 1973, now U.S. Pat. No. 3,982,942.

BACKGROUND OF THE INVENTION

1. Field of the Invention

This invention relates to photopolymerizable compositions, to polymerized products obtained therefrom, and to processes for the photopolymerization of ethylenically unsaturated compounds. More particularly, this invention relates to the discovery of a novel class of photosensitizing compositions which may be used to promote the photopolymerization of ethylenically unsaturated compounds in the presence of visible light.

2. Brief Description of the Prior Art

The polymerization of ethylenically unsaturated monomers with various compounds, such as peroxides and metal carbonyls, is known. See Bamford et al., Proceedings of Chemical Society (1962), page 110, CA 57, 12690y, who disclose the polymerization of methyl methacrylate at 100° C. with a metal carbonyl, such as iron carbonyl, dissolved in a halogen compound, such as carbon tetrachloride and chloroform.

The photopolymerization of ethylenically unsaturated organic compounds by exposure to high intensity radiation, such as, ultraviolet rays, is also known in the prior art. It is also known that photopolymerization initiators, often referred to in the art as photosensitizers or photoinitiators, may be added to the ethylenically unsaturated organic compounds to accelerate their polymerization rate on exposure to high intensity radiation. See Strohmeir et al., Naturforsch 19b 882 (1964), CA 62, 2825e; U.S. Pat. Nos. 2,850,445 and 2,875,047; Mc-Closkey et al., Industrial and Engineering Chemistry, October, 1955, pages 2125-2129; and Bamford et al., Proc. Roy. Soc. (London), A 284, 455 (1965). These photopolymerization initiators absorb light rays and, as a result, free radicals are formed which are capable of initiating polymerization. Although the photopolymerization initiators described heretofore do accelerate the polymerization of ethylenically unsaturated compounds on exposure to high intensity radiation, the practical applications thereof have proven to be somewhat limited as the photopolymerization initiators proposed heretofore suffer one or more disadvantages. A major disadvantage of numerous photopolymerization initiators proposed in the prior art is that they require the use of ultraviolet radiation or at least the use of a light source which contains a substantial component thereof of ultraviolet radiation. Another disadvantage of many photopolymerization initiators proposed heretofore is that they require the polymerization to take place in the absence of air since the oxygen in the air tends to inhibit photopolymerization, especially when the material to be polymerized is in the form of a thin film. Various methods of excluding oxygen have been proposed, but they have proven in practice to be too cumbersome and expensive to use. Accordingly, there is a great need in the art for an improved photopolymerization initiator which will function in the presence or absence of atmospheric oxygen and which does not require the presence of ultraviolet radiation but which will sensitize the photopolymerization of ethylenically unsaturated compounds on exposure to visible light rays having a wave length from 4,000 to 7,000 angstroms.

SUMMARY OF THE INVENTION

The present invention is broadly directed to the unexpected discovery that a combination of $Mn_2(CO)_{10}$ and a co-catalyst selected from the group consisting of a compound characterized by the formula

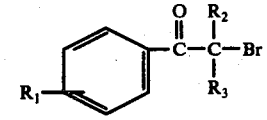

wherein $R_1$ is —H, —Br, or —CH$_3$, $R_2$ is —H or —CH$_3$, and $R_3$ is —H or —CH$_3$; cumene; diisopropyl benzene; alkyl mercaptans containing from 10 to 16 carbon atoms; thiourea; and mixtures thereof is capable of photosensitizing the polymerization of ethylenically unsaturated compounds upon exposure to visible light rays having a wave length between 4,000 and 7,000 angstroms. Accordingly, the present invention provides a photopolymerizable composition which is polymerized by exposure to visible light radiation and which composition comprises a mixture of at least one ethylenically unsaturated compound $Mn_2(CO)_{10}$ and a co-catalyst selected from the group consisting of a compound characterized by the formula

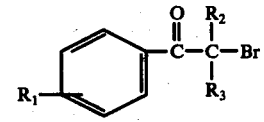

wherein $R_1$ is —H, —Br, or —CH$_3$, $R_2$ is —H or —CH$_3$, and $R_3$ is —H or —CH$_3$; cumene; diisopropyl benzene; alkyl mercaptans containing from 10 to 16 carbon atoms; thiourea; and mixtures thereof. There is also provided in accordance with the present invention a process for the photopolymerization of ethylenically unsaturated organic compounds which comprises irradiating a photopolymerizable composition comprising an ethylenically unsaturated organic compound, $Mn_2(CO)_{10}$ and a co-catalyst selected from the group consisting of a compound characterized by the formula

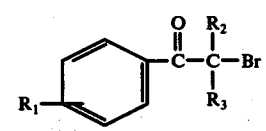

wherein $R_1$ is —H, —Br, or —CH$_3$, $R_2$ is —H or —CH$_3$, and $R_3$ is —H or —CH$_3$; cumene; diisopropyl benzene; alkyl mercaptans containing from 10 to 16 carbon atoms; thiourea; and mixtures thereof with visible light of wave lengths ranging from 4,000 to 7,000 angstroms.

The photopolymerizable compositions of this invention may be characterized in that, when subjected to visible light, they polymerize or harden to almost colorless, cured products. The polymerization is extremely rapid and may be carried out in the presence of or absence of oxygen. A further advantage of the photopolymerizable compositions of this invention is that their storability in the dark is practically unlimited and they can, therefore, be used as stable single-component systems.

DESCRIPTION OF PREFERRED EMBODIMENTS OF THE INVENTION

The only essential ingredients of the photopolymerizable compositions of this invention are at least one ethylenically unsaturated compound, $Mn_2(CO)_{10}$, and at least one co-catalyst. It will be understood, of course, that more than one of each of these essential ingredients may be employed in the photopolymerizable compositions of this invention. Although not required, additional compounds which are conventionally used in the art in connection with polymerizable compositions may be employed herein.

Illustrative examples of co-catalysts within the aforesaid formula include, alpha-bromoacetophenone, alpha-bromopropiophenone, alpha-bromoisobutyrophenone, alpha-para-dibromoacetophenone, alpha-para-dibromoisobutyrophenone, alpha-para-dibromopropiophenone, para-methyl-alpha-bromoacetophenone, para-methyl-alpha-bromoisobutyrophenone, and para-methyl-alpha-bromopropiophenone.

The amount of $Mn_2(CO)_{10}$ and co-catalyst which may be employed in the photopolymerizable compositions of this invention are, of course, dependent upon many variables including the particular co-catalyst used, the wave length of light employed, the irradiation time, and the particular ethylenically unsaturated compound present. Generally, the amount of $Mn_2(CO)_{10}$ employed is within the range of 0.05 to 5% by weight, and preferably from 0.1 to 2% by weight, and the amount of co-catalyst employed is within the range of 0.1 to 5% by weight, and preferably from 0.5 to 2% by weight, all based on the weight of the ethylenically unsaturated photopolymerizable compound present in the initial composition. The weight ratio of co-catalyst to $Mn_2(CO)_{10}$ is generally from 0.2 to 10. It will be understood that the foregoing ranges are given for the purpose of aiding in the selection of the appropriate amount of photosensitizers which give an exceptionally good polymerization rate and are economical. It will be understood, of course, that smaller amounts may be employed if one is not particularly concerned about the polymerization rate and that larger amounts may be employed if one is not particularly concerned about the economics of the process. Accordingly, the amount of $Mn_2(CO)_{10}$ and co-catalyst employed is generally from that amount which is sufficient to give a suitable polymerization rate up to that amount which may make the process uneconomical.

The ethylenically unsaturated photopolymerizable compounds which may be polymerized in accordance with the present invention include any ethylenically unsaturated compound which is capable of free-radical polymerization, including monomers, dimers, trimers, oligomers, prepolymers, and mixtures thereof. Illustrative examples of ethylenically unsaturated compounds which may be employed in the photopolymerizable compositions of this invention include: ethylenically unsaturated monocarboxylic acids, such as, acrylic acid, methacrylic acid, ethacrylic acid, and itaconic acid; esters of ethylenically unsaturated mono- and dicarboxylic acids and anhydrides and saturated or ethylenically unsaturated alcohols and esters of ethylenically unsaturated alcohols and saturated acids, including esters of any of the aforementioned acids with alcohols like methanol, ethanol, propanol, butanol, pentanol, ethylene glycol, propylene glycol, pentaerythritol, sorbitol, and glycerine; vinylidene compounds, such as, styrene, acrylamide, acrylonitrile, alphamethyl styrene, methacrylamide, methyl methacrylate, diethylaminoethyl methacrylate, and methacrylonitrile; unsaturated polyurethanes; unsaturated polyethers; unsaturated polyesters; and polyethylenically unsaturated compounds, such as, divinyl benzene, N,N'-alkylene-bis-acrylamides, and diglycol diacrylates. Additional compounds include the polyacrylates and polymethacrylates of ethylene glycol, triethylene glycol, tetraethylene glycol, tetramethylene glycol, trimethylolethane, and trimethylolpropane. A particularly preferred ethylenically unsaturated composition which may be polymerized in accordance with the present invention include a solution of an ethylenically unsaturated polyester dissolved in ethylenically unsaturated copolymerizable monomer.

The ethylenically unsaturated polyesters may be prepared by reacting an ethylenically unsaturated dicarboxylic acid with a polyl. Illustrative examples of polyols include ethylene glycol, diethylene glycol, propane glycol, propane diol, butane diol, hexane diol, pentaerythritol, trimethylol propane, alkylene oxide ethers of these polyols and alkylene oxide ethers of dihydric phenols, such as alkylene oxide ethers of 2,2-bis(4-hydroxyphenyl)propane; bis(4-hydroxyphenyl)methane; 2,2-bis(3- methyl-4-hydroxyphenyl)butane; resorcinol; 4,4'-dihydroxybiphenyl; hydroquinone; hydrogenated 2,2'-bis(4-hydroxyphenyl)propane; 4,4'-dihydroxydiphenyl ketone; 2,4-dihydroxybenzophenone; 4,4'-dihydroxydiphenyl ether; 4,4'-dihydroxydiphenyl sulfone; and 4,4'-dihydroxydiphenyl ketone. A preferred class of polyoxyalkylene ethers of dihydrophenols includes those represented by the formula:

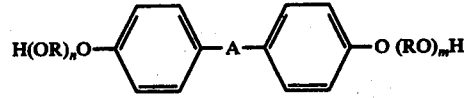

wherein n and m are integer and the sum of n and m is from 2 to 20, A is an alkylene radical having from 1 to 4 carbon atoms, and R is an alkylene radical having from 2 to 4 carbon atoms. Polyoxyalkylene ether diols corresponding to the above formula and the preparation thereof are disclosed in U.S. Pat. No. 2,331,265, the disclosure of which is hereby incorporated hereinto by reference.

Illustrative examples of ethylenically unsaturated dicarboxylic acids and anhydrides which may be used to form the polyester compositions include maleic acid, fumaric acid, and maleic anhydride.

The ethylenically unsaturated polyester compositions may also be prepared by the reaction of a polyol with a mixture of ethylenically unsaturated dicarboxylic acid and saturated dicarboxylic acid, such as, adipic acid, succinic acid, oxalic acid, phthalic acid and isophthalic acid, provided that at least about 50% of the dicarboxylic acid moieties of the polyester composition are contributed by an ethylenically unsaturated dicarboxylic acid. While unsaturated polyesters of mixed acid which do not meet this proviso may be polymerized in accordance with this invention, such polyesters are not within a preferred class of ethylenically unsaturated polyesters of this invention. A more detailed description of the polyesters which may be used in accordance with this invention may be found in U.S. Pat. No. 2,634,251 and U.S. Pat. No. 3,214,491, the disclosures of which are hereby incorporated hereinto by reference.

Illustrative examples of the numerous ethylenically unsaturated copolymerizable monomers which may be used to dissolve the ethylenically unsaturated polyesters and thereby form the polymerizable solutions, include vinylidene monomers such as styrene, vinyl toluene, vinyl pyridine, acrylonitrile, divinyl benzene, chlorostyrene, diallyl phthalate, methyl methacrylate, ethyl acrylate, vinyl acetate, and 2-ethylhexyl acrylate.

The photopolymerizable compositions of the present invention are stable and may be stored for long periods of time without gelation provided they are stored at a suitable temperature in the absence of light. Although the stability of the photopolymerizable compositions of this invention are excellent, the storage stability thereof may be increased by including in the photopolymerizable composition any of the known polymerization inhibitors, for example, parabenzoquinone, 2,5-ditertiary butylquinone, tertiary butyl-pyrocatechol, hydroquinone, 3-methylpyrocatechol, 4-ethyl-pyrocatechol, and copper naphthenate.

When the photopolymerizable compositions of this invention are exposed to visible light rays having a wave length from 4,000 to 7,000 angstroms, the photopolymerizable compositions, after a brief induction period, are rapidly polymerized. While the use of ultraviolet radiation is not necessary in order to obtain the rapid photopolymerization of the above-described compositions, the presence of ultraviolet rays are not injurious to the photopolymerization of the above-described compounds. Accordingly, the photopolymerization process of this invention may be carried out by merely exposing the above-described photopolymerizable compositions to only visible light rays or to a mixture of visible and ultraviolet light.

In carrying out the photopolymerization process of this invention, there is no need to exclude the presence of oxygen, although oxygen may be excluded if desired, as the presence of oxygen does not interfere with the photopolymerization of ethylenically unsaturated compounds when they are sensitized with a photosensitizing sensitizer compound of this invention.

The rate at which the photopolymerizable compositions will cure is determined by several variables including the specific ingredients in the photopolymerizable composition, the concentration of the photoinitiators employed, thickness of the material, nature and intensity of the radition source and its distance from the photopolymerizable composition, and the temperature of the surrounding atmosphere. When the photopolymerizable composition is in the form of a thin film, for example, thickness of from 0.5 to 150 microns, the cure time will vary from a few seconds to a few minutes; whereas, when the photopolymerizable composition is in the form a thick laminate or molded article, the cure time may vary from several seconds to an hour or more.

The cure time of the photopolymerizable compositions of this invention may be shortened by the addition thereto of an organic peroxide. The organic peroxide employed may be any peroxide which decomposes at temperatures from 25° C. to 172° C. to form free radicals. A preferred class of organic peroxides includes those which have a decomposition rate such that at least 50% of the peroxide will decompose to form free radicals in less than 10 hours when maintained at a temperature from 25° C. to 172° C. A preferred organic peroxide is tertiary butyl peroxy pivalate. Illustrative examples of other organic peroxides which may be employed include tertiary butyl perbenzoate, dicumyl peroxide, cumyl butyl peroxide, benzoyl peroxide, 2,4-dichlorobenzoyl peroxide, decanoyl peroxide, caprylyl peroxide, propionyl peroxide, acetyl peroxide, p-chlorobenzoyl peroxide, t-butyl peroxyisobutyrate, hydroxyheptyl peroxide, cyclohexanone peroxides, 2,5-dimethylhexyl-2,5-di-(peroxybenzoate), t-butyl peracetate, di-t-butyl diperphthalate, methyl ethyl ketone peroxides, 2,5-dimethyl-2,5-di-(t-butyl peroxy)hexane, t-butyl hydroperoxide, di-t-butyl peroxide, 2,5-dimethyl-2,5-di-(t-butyl peroxy)hexyne-3, p-methane hydroperoxide, 2,5-dimethyl hexyl-2,5-dihydroperoxide, cumene hydroperoxide, succinic acid peroxide, and lauryl peroxide. A mixture of organic peroxides may be used if desired. The use of an organic peroxide in conjunction with the $Mn_2(CO)_{10}$ and co-catalyst described above is particularly advantageous when the photopolymerizable composition is in the form of a thick laminate.

Suitable light sources include carbon acrs, mercury and vapor lamps, fluorescent lamps, argon glow lamps, photographic flood lamps, tungsten lamps, and ordinary daylight. A preferred source of radiation may be obtained from a 1-kilowatt tungsten filament lamp. Distances of the light source from the photopolymerizable composition is generally from about ¼ to 10 inches, and preferably from about 3 to 6 inches.

The photopolymerization reaction of this invention may be carried out according to any of the well-known processes, such as, bulk, emulsion, suspension, and solution polymerization processes. The only requirement is that the sensitizer combination of metal carbonyl complex and co-catalyst be brought into intimate contact with the photopolymerizable composition so as to facilitate the generation of free radicals therein when exposed to visible light rays.

The photopolymerizable compositions of this invention may include chain transfer agents. Illustrative examples of transfer agents include the mercaptans and derivatives thereof, such as, glycol mercaptoacetate, and ethyl mercaptoacetate; tertairy aliphatic amines, such as, triethanolamine and tertiary butyl diethanolamine, morpholine; n-aminomorpholine; and cyclicized unsaturated hydrocarbons, such as, neohexene, cyclohexene, cyclooctene, and mixtures thereof. The amount of transfer agent employed may vary from 0.5 to 20% by weight of the total composition.

In addition to the above-described ingredients, the compositions of the present invention may contain additional agents including stabilizers, dyes, pigments, plasticizers, lubricants, glass fibers, and other modifiers which are conventional in the art to obtaining certain desired characteristics in the finished products.

The photopolymerizable compositions of the present invention are suitable as adhesives, particularly for use in the laminating art; as coatings for metals, plastics, textiles, paper, and glass; as markers for roads, parking lots, airfields, and similar surfaces; as vehicles for printing inks, lacquers, and paints; and in the preparation of photopolymerizable elements, for example, a support having disposed thereon a photopolymerizable layer of a composition as described herein.

The photopolymerizable compositions of this invention are particularly useful in the preparation of printing plates and photographic etching resists which can be further used as planographic printing plates, as matrixes for printing matter, as screens for silk screen printing;

and as photoresists for etching. The photopolymerizable composition is spread upon a surface, such as a surface of metal, and a design is printed thereon photographically by exposure to light through a suitable image pattern. The light induces polymerization in the exposed area of the photopolymerizable composition whereby the polymeric layer is rendered insoluble in the solvent or solvents used for applying the photopolymerizable layer. Thereafter, the nonexposed areas are washed away with solvent for the monomeric material.

In the production of molded articles with the photopolymerizable compositions, it is especially advantageous that the composition may be hardened by appropriately measured irradiation, without any notable external heat supply, so that almost crack-free molded articles may be formed. If necessary, the hardening process may be interrupted by removing the light source and the hardening process terminated with the intermediate production of prepolymers. These prepolymers are stable when stored in the dark. The photopolymerization process may be initiated again by exposure of the prepolymers to light.

When a photopolymerizable composition of the present invention is used in the form of a laminate, for example, as an adhesive between two adjacent layers, at least one of the layers must be translucent to visible light. As mentioned above, the addition of organic peroxides to the photopolymerizable composition is particularly preferred when the compositions are used to form laminates. Typical laminations include cellophane to cellophane films, treated polyethylene to treated polyethylene films, and Mylar to a metal substrate.

In order that those skilled in the art may better understood how the present invention may be practiced, the following examples are given. These examples are set forth solely for the purpose of illustration and any specific enumeration of details contained therein should not be interpreted as expressing limitations of this invention. All parts and percentages are by weight unless otherwise stated.

EXAMPLE 1

A solution of equal parts styrene and polyoxypropylene (2.2) 2,2-bis(4-hydroxyphenyl)propane fumarate is sensitized with 1% by weight of manganese carbonyl [$Mn_2(CO)_{10}$] and 1% alpha-bromoisobutyrophenone. The sensitized solution is thoroughly mixed and coated on the surfaces of steel, copper, galvanized zinc plate, and plywood. The coatings are then illuminated with visible light from a tunsten filament lamp in the presence of air. After 10 minutes of exposure to visible light, the polymers are cured and the surfaces of the coating are smooth and non-tacky

EXAMPLE 2

Example 1 was repeated except that 1% by weight of tertiary butyl peroxy pivalate is added to the sensitized solution, and the coating is illuminated with visible light for 5 minutes. The resulting cured coatings are smooth and non-tacky.

Examples 3 through 8 show the polymerization of methyl methacrylate using various combination of sensitizing compositions of this invention. The procedure employed is as follows: Into a 5-inch pyrex test tube is placed 0.05 grams of $Mn_2(CO)_{10}$, 10 grams of methyl methacrylate, 0.1 grams of the indicated co-catalyst, and, where indicated, 0.1 grams of tertiary butyl peroxy pivalate. The solutions are thoroughly mixed and illuminated with visible light from a 1,000 watt tungsten filament lamp at a distance of 6 inches. The solution is illuminated without degassing or flushing with nitrogen. The solutions are illuminated for from 45 to 60 minutes. The formation of polymethyl methacrylate is observed in each case. The composition of the photopolymerization initiator employed is shown in Table I.

TABLE I

| Example Number | Co-Catalyst |
|---|---|
| 3 | Alpha-bromoacetophenone |
| 4 | Alpha-bromoisobutyrophenone |
| 5 | Cumene |
| 6 | Diisopropyl Benzene |
| 7 | Mixture of Alkyl Mercaptane Containing 12-16 Carbons |
| 8 | Thiourea |

Examples 9, 10 amd 11 show the use of various photopolymerization initiator combinations for curing polyester castings. The following procedure is used in Examples 9 through 11. ⅛ inch castings are prepared in a conventional plate glass mold from a solution of equal parts styrene and polyoxypropylene (2.2) 2.2-bis(4-hydroxyphenyl)propane which has been sensitized with 0.5% of $Mn_2(CO)_{10}$, 1% of the indicated co-ctalyst, and, where indicated, 1% of tertiary butyl peroxy pivalate. The castings are illuminated with visible light from a 1,000 watt tungsten filament lamp. The castings are placed 6 inches from the light source. The samples are then removed from the light source and the Barcol hardness of the cured products determined. The particular photopolymerization initiator combination employed and the results obtained are shown in Table II.

TABLE II

| Example Number | Co-Catalyst | Peroxide | Time of Illumination | Barcol Hardness |
|---|---|---|---|---|
| 9 | BIBP | — | 60 | 20–23 |
| 10 | BIBP | TBPP | 20 | 34–38 |
| 11 | BAP | TBPP | 16 | 40–42 |

BIBP = alpha-bromoisobutyrophenone
TBPP = tertiary butyl peroxy pivalate
BAP = alpha-bromoacetophenone

EXAMPLE 12

Into a 5-inch pyrex test tube is placed 0.5 gram of $Mn_2(CO)_{10}$, 10 grams of methyl acrylate, and 0.1 gram of alpha-para-dibromoacetophenone. The solution is thoroughly mixed and illuminated with visible light for two hours. The formation of polymethyl acrylate is observed.

EXAMPLE 13

Into a 5-inch pyrex test tube is placed 0.05 gram of $Mn_2(CO)_{10}$, 10 grams of methyl acrylate, and 0.1 gram of alpha-bromo-p-methylacetophenone. The solution is thoroughly mixed and illuminated with visible light for two hours. The formation of polymethyl acrylate is observed.

EXAMPLE 14

Into a 5-inch pyrex test tube is placed 0.05 gram of $Mn_2(CO)_{10}$, 10 grams of methyl acrylate, and 0.1 gram of 4'-methyl-alpha-bromopropiophenone. The solution is thoroughly mixed and illuminated with visible light for two hours. The formation of polymethyl acrylate is observed.

Although this invention has been described with reference to specific photosensitizing compositions and ethylenically unsaturated polymerizable compounds and to specific reaction conditions, it will be appreciated that numerous other ethylenically unsaturated compounds and photosensitizing compositions, including additional metal carbonyl complexes and co-catalysts, may be substituted for those specifically described and that the particular reaction conditions employed may be modified, all within the spirit and scope of this invention.

Having thus described the invention, what is desired to be secured by Letters Patent is:

1. A photopolymerizable composition comprising an ethylenically unsaturated compound and a photosensitizing composition comprising a blend of from 0.05% to 5% by weight, based on the weight of ethylenically unsaturated compound, of $Mn_2(CO)_{10}$ and from 0.1% to 5% by weight, based on the weight of ethylenically unsaturated compound, of a co-catalyst selected from the group consisting of cumene, diisopropyl benzene, alkyl mercaptans containing from 10 to 16 carbon atoms, and mixtures thereof, wherein the weight ratio of co-catalyst to $Mn_2(CO)_{10}$ is from 0.2 to 10.

2. A photopolymerizable composition of claim 1 wherein the co-catalyst is cumene.

3. A photopolymerizable composition of claim 1 wherein the co-catalyst is diisopropylbenzene.

4. A photopolymerizable composition of claim 1 wherein the co-catalyst is an alkyl mercaptan containing from 10 to 16 carbon atoms.

5. A composition of claim 1 wherein the ethylenically unsaturated compound comprises a solution of an ethylenically unsaturated polyester in an ethylenically unsaturated monomer.

6. A composition of claim 5 which contains an organic peroxide.

7. A composition which is suitable for photosensitizing ethylenically unsaturated compounds to visible light which comprises a mixture of $Mn_2(CO)_{10}$ and a co-catalyst selected from the group consisting of cumene, diisopropylbenzene, alkyl mercaptans containing from 10 to 16 carbon atoms, thiourea and mixtures thereof wherein the weight ratio of co-catalyst to $Mn_2(CO)_{10}$ is from 0.2 to 10.

* * * * *

UNITED STATES PATENT AND TRADEMARK OFFICE
CERTIFICATE OF CORRECTION

PATENT NO. : 4,053,316
DATED : October 11, 1977
INVENTOR(S) : Robert T. Lu

It is certified that error appears in the above-identified patent and that said Letters Patent are hereby corrected as shown below:

Column 2, line 29, "charaacterized" should read --characterized--.

Column 4, line 15, "include" should read -- includes --.

Column 4, line 21, "polyl" should read -- polyol --.

Column 5, line 44, "sensitizer compound" should read -- sensitizer composition --.

Column 7, line 34, "understood" should read -- understand --.

Column 8, Example 7 under Table I, "Mercaptane" should read -- Mercaptans --.

Column 8, line 23, "2.2-bis(4-hydroxyphenyl)propane" should read -- 2,2-bis(4-hydroxyphenyl)propane --.

Column 8, line 46, "0.5 gram" should read -- 0.05 gram --.

Signed and Sealed this

Fourteenth Day of February 1978

[SEAL]

Attest:

RUTH C. MASON
*Attesting Officer*

LUTRELLE F. PARKER
*Acting Commissioner of Patents and Trademarks*